US009953568B2

(12) United States Patent
Yu et al.

(10) Patent No.: US 9,953,568 B2
(45) Date of Patent: Apr. 24, 2018

(54) ORGANIC LIGHT EMITTING DIODE DISPLAY DEVICE AND DRIVING METHOD THEREOF

(71) Applicant: LG Display Co., Ltd., Seoul (KR)

(72) Inventors: Sang Ho Yu, Paju-si (KR); Tae Gung Kim, Paju-si (KR); Jong Min Lee, Paju-si (KR); Myung Gi Lim, Ansan-si (KR); Hye Mi Oh, Gwangju (KR); Hun Ki Shin, Paju-si (KR); Jin han Yoon, Gimhae-si (KR)

(73) Assignee: LG Dispay Co., Ltd., Seoul (KR)

( * ) Notice: Subject to any disclaimer, the term of this patent is extended or adjusted under 35 U.S.C. 154(b) by 31 days.

(21) Appl. No.: 14/710,327

(22) Filed: May 12, 2015

(65) Prior Publication Data

US 2015/0325174 A1 Nov. 12, 2015

(30) Foreign Application Priority Data

May 12, 2014 (KR) ........................ 10-2014-0056584

(51) Int. Cl.
*G09G 3/3233* (2016.01)
*G09G 3/3241* (2016.01)
*H01L 27/32* (2006.01)

(52) U.S. Cl.
CPC ......... *G09G 3/3233* (2013.01); *G09G 3/3241* (2013.01); *H01L 27/32* (2013.01); *G09G 2300/0852* (2013.01); *G09G 2320/0233* (2013.01); *G09G 2320/045* (2013.01)

(58) Field of Classification Search
None
See application file for complete search history.

(56) References Cited

U.S. PATENT DOCUMENTS

2005/0285825 A1 12/2005 Eom et al.
2007/0001958 A1 1/2007 Lee et al.
2007/0257623 A1 11/2007 Johnson et al.
(Continued)

FOREIGN PATENT DOCUMENTS

CN 1223979 C 10/2005
CN 1679073 A 10/2005
(Continued)

OTHER PUBLICATIONS

Chinese First Office Action, Chinese Application No. 201510239526.X, Mar. 31, 2017, 9 pages (with concise explanation of relevance).

(Continued)

*Primary Examiner* — Nicholas Lee
*Assistant Examiner* — Benjamin Casarez
(74) *Attorney, Agent, or Firm* — Fenwick & West LLP

(57) ABSTRACT

An organic light emitting diode display device is disclosed which includes: a scan switch controlled by a scan pulse on a gate line and connected between a data line and a first node; a driving switch which includes a gate electrode connected to the first node, a source electrode connected to a second node, and a drain electrode connected to a first driving voltage line; a sensing switch controlled by a sensing control signal and connected between the second node and a third node on a sensing line; and an organic light emitting diode connected between the second node and a second driving voltage line.

19 Claims, 11 Drawing Sheets

(56) References Cited

U.S. PATENT DOCUMENTS

2008/0068310 A1* 3/2008 Choi .................... G09G 3/3233 345/82
2008/0266330 A1 10/2008 Park et al.
2009/0213046 A1* 8/2009 Nam .................... G09G 3/3233 345/76
2009/0284451 A1* 11/2009 Yamamoto ........... G09G 3/3233 345/77
2010/0073357 A1* 3/2010 Min ..................... G09G 3/3233 345/214
2011/0084955 A1* 4/2011 Kim ..................... G09G 3/3283 345/212
2011/0205250 A1* 8/2011 Yoo ...................... G09G 3/3233 345/690
2011/0254871 A1* 10/2011 Yoo ...................... G09G 3/3233 345/690
2012/0293478 A1* 11/2012 Chaji ................... G09G 3/3258 345/212
2012/0299978 A1* 11/2012 Chaji ................... G09G 3/3291 345/690
2012/0327065 A1* 12/2012 Nam .................... G09G 3/3233 345/212
2013/0050292 A1* 2/2013 Mizukoshi ........... G09G 3/3291 345/690
2013/0083001 A1* 4/2013 Jeong ................... G09G 3/3233 345/212
2014/0022289 A1* 1/2014 Lee ...................... G09G 3/3283 345/691
2014/0152642 A1* 6/2014 Kim ..................... G09G 3/3233 345/212
2014/0232705 A1* 8/2014 Fujii .................... G09G 3/3258 345/204
2014/0320475 A1* 10/2014 Shin ..................... G09G 3/3275 345/212
2015/0123883 A1* 5/2015 Lin ...................... G09G 3/3233 345/76
2015/0130785 A1* 5/2015 Shin ..................... G09G 3/3233 345/213
2016/0055791 A1* 2/2016 Kishi ................... G09G 3/3241 345/212
2016/0189621 A1* 6/2016 Kim ..................... G09G 3/3258 345/215

FOREIGN PATENT DOCUMENTS

CN 101123071 A 2/2008
CN 101515434 A 8/2009
CN 102163402 A 8/2011
CN 102222463 A 10/2011

OTHER PUBLICATIONS

Chinese Second Office Action, Chinese Application No. 201510239526.X, dated Aug. 29, 2017, 12 pages.

* cited by examiner

ORGANIC LIGHT EMITTING DIODE DISPLAY DEVICE AND DRIVING METHOD THEREOF

The present application claims priority under 35 U.S.C. § 119(a) of Korean Patent Application No. 10-2014-0056584 filed on May 12, 2014, which is hereby incorporated by reference in its entirety.

BACKGROUND

Field of the Disclosure

The present application relates to an organic light emitting diode display device and a driving method thereof.

Description of the Related Art

Recently, a variety of flat panel display devices with reduced weight and volume corresponding to disadvantages of cathode ray tube (CRT) are being developed. The flat panel display devices include liquid crystal display (LCD) devices, field emission display (FED) devices, plasma display panels (PDPs), electroluminescence devices and so on.

The PDPs have advantages such as a simple manufacturing process, lightness and thinness, and easiness to provide a large-sized screen. In view of these points, the PDPs attract public attention. However, the PDPs have serious problems such as low light emission efficiency, low brightness and high power consumption. Also, thin film transistor LCD devices use thin film transistors as switching elements. Such thin film transistor LCD devices are being widely used as the flat display devices. However, the thin film transistor LCD devices have disadvantages such as a narrow viewing angle and a low response time, because of being non-luminous devices. Meanwhile, the electroluminescence display devices are classified into an inorganic light emitting diode display device and an organic light emitting diode display device on the basis of the formation material of a light emission layer. The organic light emitting diode display device corresponding to a self-illuminating display device has features such as high response time, high light emission efficiency, high brightness and wide viewing angle.

The organic light emitting diode display device controls a voltage between a gate electrode and a source electrode of a driving transistor. As such, a current flowing from a drain electrode of the driving transistor toward a source electrode of the driving transistor can be controlled.

The current passing through the drain and source electrodes of the driving transistor is applied to an organic light emitting diode and allows the organic light emitting diode to emit light. Light emission quantity of the organic light emitting diode can be controlled by adjusting the current quantity flowing into the organic light emitting diode.

The current flowing through the organic light emitting diode is largely affected a threshold voltage Vth and mobility of the driving transistor. As such, the threshold voltage and mobility of the driving transistor should be accurately measured and compensated.

BRIEF SUMMARY

Accordingly, embodiments of the present application are directed to an organic light emitting diode display device and a driving method thereof that substantially obviate one or more of problems due to the limitations and disadvantages of the related art.

The embodiments relate to provide an organic light emitting diode display device and a driving method thereof which are adapted to detect a threshold voltage of a driving transistor and accurately control a current flowing through an organic light emitting diode.

Also, the embodiments relate to provide an organic light emitting diode display device and a driving method thereof which are adapted to enhance the accuracy of compensation through mobility detection of a driving transistor.

Moreover, the embodiments relate to provide an organic light emitting diode display device and a driving method thereof which are adapted to enhance the accuracy of compensation by eliminating error components which are caused by the capacitance of a capacitor on a sensing line and abnormal properties of elements.

An organic light emitting diode display device according to an aspect of the present embodiment includes: a scan switch controlled by a scan pulse on a gate line and connected between a data line and a first node; a driving switch which includes a gate electrode connected to the first node, a source electrode connected to a second node, and a drain electrode connected to a first driving voltage line; a sensing switch controlled by a sensing control signal and connected between the second node and a third node on a sensing line; and an organic light emitting diode connected between the second node and a second driving voltage line, wherein the scan switch and the sensing switch are turned-on and allow a first reference voltage to be applied to the first node in a first initialization interval, voltages on the second and third nodes are varied in a first sensing interval, and the voltage on the third node is detected in a first sampling interval and reflected in a second reference voltage as a threshold voltage of the driving switch.

The organic light emitting diode display device according to an aspect of the present disclosure applies an initialization voltage to the third node through the sensing line in the first initialization interval and floats the second node in the first sensing interval.

In the organic light emitting diode display device according to an aspect of the present disclosure, the scan switch and the sensing switch are turned-on and allow the second reference voltage to be applied to the first node during a second initialization interval, the voltages on the second and third nodes are varied during a second sensing interval, and the voltage on the third node is detected and used to compensate for mobility of the driving switch.

The organic light emitting diode display device according to an aspect of the present disclosure allows not only an initialization voltage to be applied to the third node through the sensing line in the second initialization interval but also the second node to be floated in the second sensing interval.

The organic light emitting diode display device according to an aspect of the present disclosure turns-off the scan switch in the second sensing interval.

The organic light emitting diode display device according to an aspect of the present disclosure turns-on the scan switch and allows a black data voltage to be transferred to the first node in the second sampling interval.

In the organic light emitting diode display device according to an aspect of the present disclosure, the black data voltage applied to the first node through the turned-on scan switch during the second sampling interval enables the second node to maintain a lower voltage than a threshold voltage of the organic light emitting diode.

The organic light emitting diode display device according to an aspect of the present disclosure allows the sensing switch to be turned-off before turning-on the scan switch during the second sampling interval.

In the organic light emitting diode display device according to an aspect of the present disclosure, the sensing switch turned-off before turning-on the scan switch enables the voltage on the third node to be constantly maintained during the second sampling interval.

The organic light emitting diode display device according to an aspect of the present disclosure allows the sensing line to be shared by a plurality of sub-pixels which each includes the scan switch, the driving switch, the sensing switch and the organic light emitting diode.

In the organic light emitting diode display device according to an aspect of the present disclosure, the plurality of sub-pixels includes red, green, blue and white sub-pixels arranged in a horizontal direction.

The organic light emitting diode display device according to an aspect of the present disclosure allows the initialization voltage to be set to be higher than a voltage on the second driving voltage line.

The organic light emitting diode display device according to an aspect of the present disclosure further includes a data driver configured to apply a data voltage and an initialization voltage to the data line and the third node on the sensing line and to detect the voltage on the third node of the sensing line.

The data driver of the organic light emitting diode display device, according to an aspect of the present disclosure, includes: a sensing circuit configured to detect the voltage on the third node of the sensing line; an analog-to-digital converter configured to convert the voltage detected by the sensing circuit into a digital value; a memory configured to store the digital value from the analog-to-digital converter; a controller configured to apply the digital value stored in the memory to a timing controller; and an initialization voltage source configured to apply the initialization voltage to the sensing line.

The organic light emitting diode display device according to an aspect of the present disclosure further includes a sampling switch electrically connected between the sensing circuit and the sensing line to be turned-on in the first and second sampling intervals.

The organic light emitting diode display device according to an aspect of the present disclosure further includes an initialization voltage switch electrically connected between the initialization voltage source and the sensing line to be turned-on in the first and second initialization intervals.

The organic light emitting diode display device according to an aspect of the present disclosure enables the sampling switch and the initialization voltage switch to be turned-off in the first and second sensing intervals.

A driving method of an organic light emitting diode display device according to another aspect of the present disclosure is applied to a display device which includes a scan switch controlled by a scan pulse and connected between a data line and a first node, a driving switch controlled by a voltage on the first node and connected between a second node and a first driving voltage line, a sensing switch controlled by a sensing control signal and connected between the second node and a third node on a sensing line, and an organic light emitting diode connected between the second node and a second driving voltage line. The driving method includes: applying a reference voltage and an initialization voltage to the first node and the second node by turning-on the scan switch and the sensing switch; enabling not only the driving switch to be driven as a constant current source but also voltages on the second node and the third node to be driven by turning-off the sensing switch and floating the sensing line; and detecting a mobility property of the driving switch by sensing the voltage on the third node after turning-off the sensing switch.

In the driving method according to another aspect of the present disclosure, the detection of the mobility property includes applying a black data voltage to the first node by turning-on the scan switch after turning-off the sensing switch.

The driving method according to another aspect of the present disclosure enables the voltage on the third node to be sensed after the black data voltage is applied to the first node.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
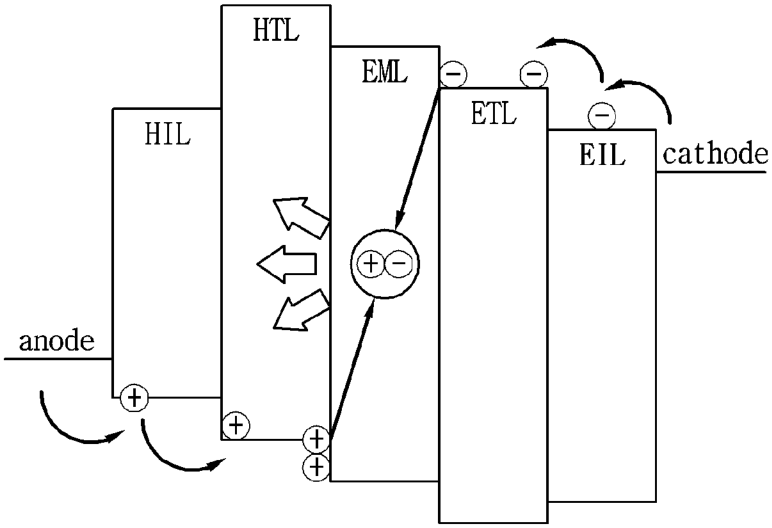
FIG. 1 is a schematic diagram showing the structure of an organic light emitting diode.

Reference will now be made in detail to an OLED display device in accordance with the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Structure of Organic Light Emitting Diode

FIG. 1 is a schematic diagram showing the structure of an organic light emitting diode.

An organic light emitting diode display device can include organic light emitting diodes shown in FIG. 1.

The organic light emitting diode can include organic compound layers HIL, HTL, EML, ETL and EIL formed between an anode electrode and a cathode electrode.

The organic compound layers can include a hole injection layer HIL, a hole transport layer HTL, an emission layer EML, an electron transport layer ETL and an electron injection layer EIL.

If a driving voltage is applied between the anode electrode and the cathode electrode, holes passing through the hole transport layer HTL and electrons passing through the electron transport layer ETL are drifted into the emission layer EML. As such, excitons are formed within the emission layer EML. In accordance therewith, visual light can be emitted from the emission layer EML.

The organic light emitting diode display device is configured with pixels, which are arranged in a matrix shape and each include the above-mentioned organic light emitting diode. Brightness of the pixel selected by a scan pulse can be controlled on the basis of a gray scale value of digital video data.

Such an organic light emitting diode display device can be classified into a passive matrix mode and an active matrix mode which is used thin film transistor as switch elements.

Among the organic light emitting diode display devices, the active matrix mode selects the pixels by selectively turning-on the thin film transistors. The selected pixel can maintain a light emitting state using a voltage charged into a storage capacitor within the pixel.

Equivalent Circuit Diagram of Active Matrix Mode Pixel

Figure 2:
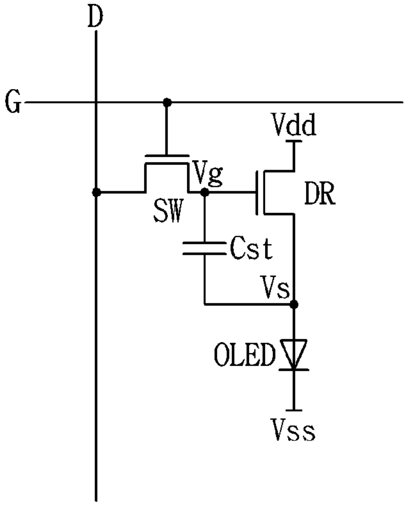
FIG. 2 is an equivalent circuit diagram showing a single pixel included in an organic light emitting diode display device of an active matrix mode.

FIG. 2 is an equivalent circuit diagram showing a single pixel included in an organic light emitting diode display device of an active matrix mode.

Referring to FIG. 2, each of the pixels within the organic light emitting diode display device of the active matrix mode includes an organic light emitting diode OLED, data and gate lines D and G, a switching transistor SW, a driving transistor DR and a storage capacitor Cst. For the switching transistor SW and the driving transistor DR, n-type MOSFETs (metal oxide semiconductor-field effect transistors) can be used.

The switching transistor SW is turned-on (or activated) in response to a scan pulse from the gate line G. As such, a current path between a source electrode and a drain electrode of the switching transistor SW is formed.

During a turned-on time interval of the switching transistor SW, a data voltage is transferred from the data line D to the storage capacitor Cst via the source electrode and the drain electrode of the switching transistor SW. The storage capacitor Cst connected to a gate electrode of the driving transistor DR stores the transferred data voltage.

The driving transistor DR controls a current (or a current quantity) flowing through the organic light emitting diode OLED on the basis of a different voltage Vgs between the gate electrode and a source electrode of the driving transistor DR.

To this end, a potential difference between the gate electrode and the source electrode of the driving transistor DR is programmed by turning-on the switching transistor SW, supplying a sensing line with an initialization voltage Vinit being lower than a threshold voltage of the organic light emitting diode OLED, and applying the data voltage to the gate electrode of the driving transistor DR via the data line D and the switching transistor SW. Thereafter, although not only the switching transistor SW and a sensing transistor SEW (not shown) are turned-off but also a voltage of the source electrode of the driving transistor DR is varied, the programmed potential difference between the gate electrode and the source electrode of the driving transistor DR is constantly maintained.

The storage capacitor Cst stores the data voltage applied to its one electrode. Such a storage capacitor Cst constantly maintains the voltage applied to the gate electrode of the driving transistor DR during a single frame period.

The organic light emitting diode OLED with the structure shown in FIG. 1 is connected between the source electrode of the driving transistor DR and a low potential driving voltage line Vss. The low potential driving voltage line Vss is connected to a low potential driving voltage source Vss not shown in the drawing.

The pixel with the configuration shown in FIG. 2 emits light of brightness in proportion to the current (or current quantity) flowing through the organic light emitting diode OLED, as represented by the following equation 1.

$$V_{gs} = V_g - V_s \qquad \text{Equation 1}$$

$$V_g = V_{data}$$

$$V_s = V_{init}$$

$$I_{oled} = \frac{\beta}{2}(V_{gs} - V_{th})^2 = \frac{\beta}{2}(V_{data} - V_{init} - V_{th})^2$$

In the equation 1, '$V_{gs}$' is the different voltage between a gate voltage $V_g$ and a source voltage $V_s$ of the driving transistor, '$V_{data}$' is the data voltage, and '$V_{init}$' is the initialization voltage. Also, '$I_{oled}$' is a driving current of the organic light emitting diode OLED, '$V_{th}$' is a threshold voltage of the driving transistor DR, and 'β' means a constant value which is determined by mobility and parasitic capacitance of the driving transistor DR.

As seen in the equation 1, it is evident that the current (or current quantity) $I_{oled}$ of the organic light emitting diode OLED is affected by the threshold voltage $V_{th}$ of the driving transistor DR.

In general, gate-bias stress increases when the gate voltage with the same polarity is applied to the gate electrode of the driving transistor DR. As such, the threshold voltage $V_{th}$ of the driving transistor DR becomes higher. Due to this, operational characteristics of the driving transistor DR should be varied.

Figure 3:
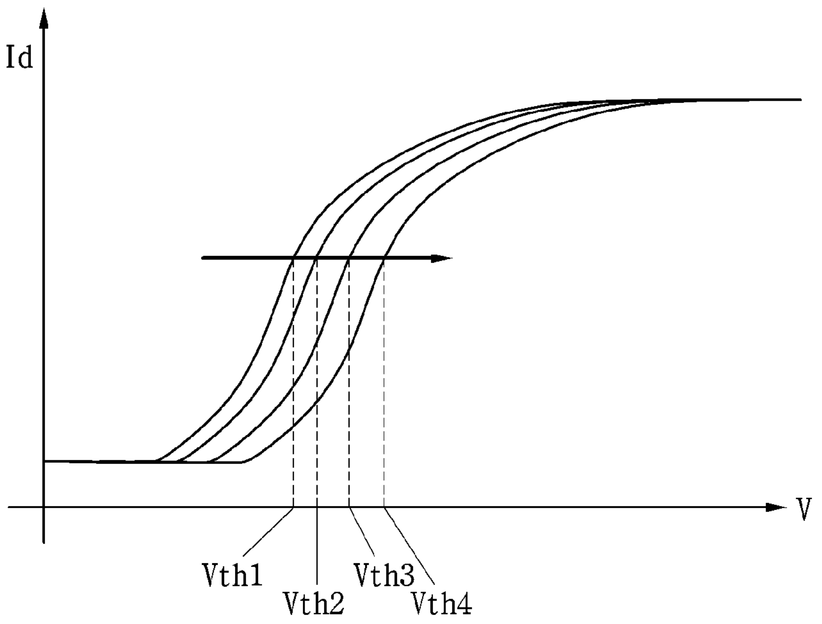
FIG. 3 is an experiment resultant sheet illustrating characteristic variation of a hydrogenated amorphous silicon (a-Si:H) thin film transistor, which is used as a sample has a channel width W of 120 and a channel length of 6, caused by applying a positive gate-bias stress.

The operational characteristic variation of the driving transistor DR is clearly revealed through experiment resultant shown in FIG. 3.

FIG. 3 is an experiment resultant sheet illustrating characteristic variation of a hydrogenated amorphous silicon (a-Si:H) thin film transistor, which is used as a sample and has a channel width W of 120 and a channel length of 6, caused by applying a positive gate-bias stress.

In FIG. 3, a lateral axis is a gate voltage Vg of the sampled a-Si:H TFT, and a vertical axis represents a current (or current quantity) flowing between the drain electrode and the source electrode of the sampled a-Si:H TFT.

When a positive voltage of about 30V is applied to the gate electrode of the sampled a-Si:H TFT, FIG. 3 shows shifted states of a threshold voltage and a transmission characteristic curve of the TFT in accordance with an applied period of the voltage.

As seen from FIG. 3, not only the transmission characteristic curve of the TFT is shifted in a right direction but also the threshold voltage Vth is shifted from Vth1 toward Vth4, as the applying period of the positive voltage for the gate electrode of the a-Si:H TFT becomes longer. The rising width of the threshold voltage of the driving transistor DR can be varied along pixels.

For example, during a long time period, a first data voltage can be applied to a first pixel and a second data voltage being higher than the first data voltage can be applied to a second pixel. In this case, the rising width of the threshold voltage of the driving transistor DR within the second pixel can be larger than that of the threshold voltage of the driving transistor DR within the first pixel.

Due to this, although the same data voltage is applied to the first pixel and the second pixel, a driving current quantity flowing through the organic light emitting diode OLED of the second pixel becomes smaller than that flowing through the organic light emitting diode of the first pixel. In accordance therewith, display quality of the organic light emitting diode display device would deteriorate.

To address this matter, a method of applying negative gate-bias stress to the driving transistor DR can be used in order to suppress the increment of the threshold voltage of the driving transistor DR. The method of applying the negative gate-bias stress and suppressing the increment of the threshold voltage of the driving transistor DR can completely compensate for driving current deviations between the pixels. This results from the fact that the current $I_{oled}$ flowing through the organic light emitting diode OLED is affected by not only the threshold voltage $V_{th}$ of the driving transistor DR but also a potential value of the sensing line S used for applying the initialization voltage $V_{init}$, a parasitic capacitor on the sensing line S used for sensing the threshold voltage $V_{th}$ and mobility of the driving transistor DR included in the 'β' as described in the equation 1.

If the driving current flows through each of the pixels on a display panel, the potential value on the sensing ling S will be varied along positions of the pixels due to resistance of the sensing line S. Also, the mobility of the driving transistor DR may differently deteriorate according driving period. As such, in order to enhance display quality by reducing the driving current deviations between the pixels, it is necessary to totally compensate for threshold voltage deviations between the driving transistors DR, the potential difference of the sensing line S and mobility deviations between the driving transistors DR.

Block Diagram of Organic Light Emitting Diode Display Device

Figure 4:
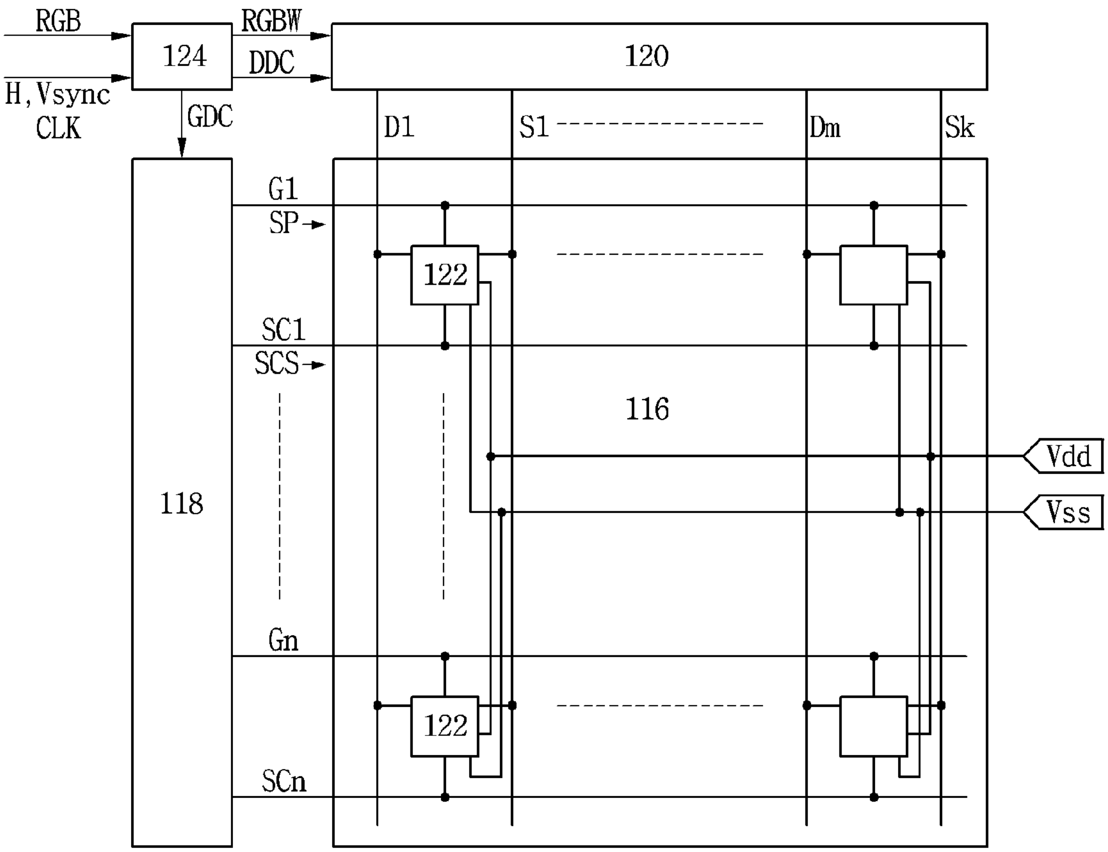
FIG. 4 is a block diagram showing an organic light emitting diode display device according to an embodiment of the present disclosure.

FIG. 4 is a block diagram showing an organic light emitting diode display device according to an embodiment of the present disclosure.

Referring to FIG. 4, an organic light emitting diode display device according to an embodiment of the present disclosure can include a display panel 116, a gate driver 118, a data driver 120 and a timing controller 124.

The display panel 116 can include m data lines D1-Dm, k sensing lines S1-Sm, n gate lines G1-Gn, n sensing control lines SC1-SCn and m×n pixels 122. The sensing lines S1-Sk can be arranged every at least two data lines. For example, the sensing lines S1-Sk can be arranged every four data lines. In this case, the m data lines D1-Dm and the k sensing lines S1-Sk can be distinguished into k groups. Meanwhile, the gate lines G1-Gn and the sensing control lines SC1-SCn are arranged alternately with each other and grouped into n pairs. The m×n pixels 122 are formed in regions which are defined by the m data lines D1-Dm and the n pairs of gate lines G1-Gn and sensing control lines SC1-SCn crossing each other.

Also, signal lines used to apply a first driving voltage Vdd to each of the pixels and signal lines used to apply a second driving voltage Vss to each of the pixels can be formed on the display panel 116. The first driving voltage Vdd can be generated in a high potential driving voltage source Vdd not shown in the drawing. The second driving voltage Vss can be generated in a low potential driving voltage source Vss not shown in the drawing.

The gate driver 118 can generate scan pulses in response to gate control signals GDC from the timing controller 124. The scan pulses can be sequentially applied to the gate lines G1-Gn.

Also, the gate driver 118 can generate sensing control signals SCS under control of the timing controller 124. The sensing control signal SCS is used to control a sensing switch (not shown) included in each of the pixels.

Although it is explained that the gate driver 118 outputs both of the scan pulses SP and the sensing control signal SCS, but the present disclosure is not limited to this. Alternatively, the organic light emitting diode display device can additionally include a sensing switch control driver which outputs the sensing control signals SCS under control of the timing controller 124.

The data driver 120 can be controlled by data control signals DDC applied from the timing controller 124. Also, the data driver 120 can apply data voltages to the data lines D1-Dm. Moreover, the data driver 120 can not only apply an initialization voltage to the sensing lines S1-Sk but also detect sensing voltages through the sensing lines S1-Sk.

The data lines D1-Dm are connected to the pixels 122. As such, the data voltages can be applied to the pixels 122 via the data lines D1-Dm.

The sensing lines S1-Sk are connected to the pixels 122. Such sensing lines S1-Sk can be used to not only apply the initialization voltages to the pixels 122 but also measure the sensing voltages for the pixels. In order to measure the sensing voltage, each pixel can be charged with the initialization voltage transferred through the sensing line S and then enter a floating state.

Although it is explained that the data driver 120 can output the data voltages and the initialization voltage and detect the sensing voltages, the present disclosure is not limited to this. Alternatively, the organic light emitting diode display device can additionally include a sensing driver which outputs the initialization voltage and detects the sensing voltages.

Configuration of Pixel

Figure 5:
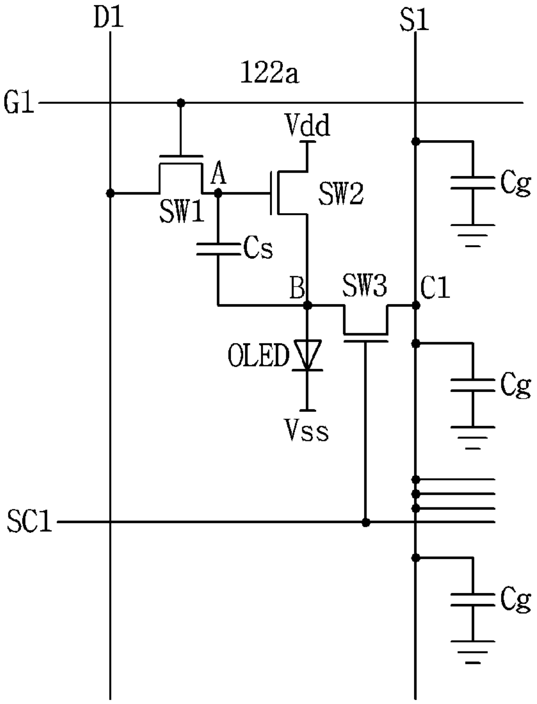
FIG. 5 is a circuit diagram showing the configuration of a sub-pixel according to an embodiment of the present disclosure.
Figure 6:
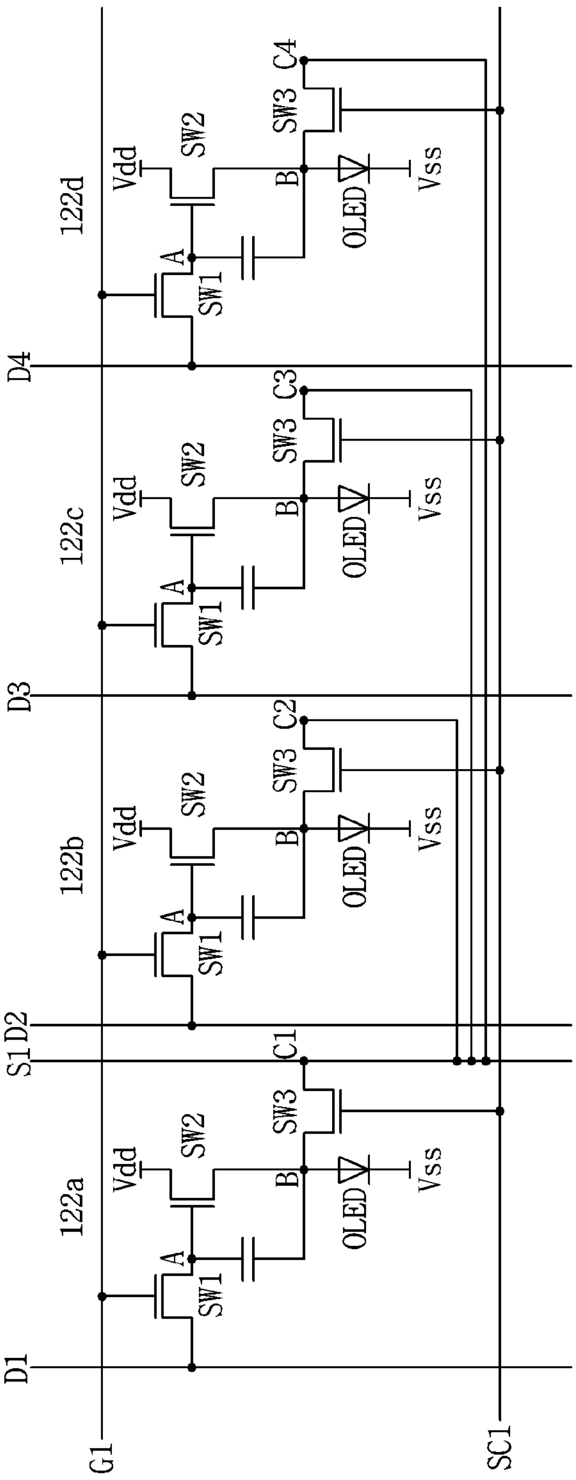
FIG. 6 is a circuit diagram showing four sub-pixels which each have the configuration of FIG. 5 and are arranged in a horizontal direction.

FIG. 5 is a circuit diagram showing the configuration of a sub-pixel according to an embodiment of the present disclosure. FIG. 6 is a circuit diagram showing four sub-pixels which are arranged in a horizontal direction and each have the configuration of FIG. 5.

Each of the pixels of FIG. 4 can include sub-pixels shown in FIGS. 5 and 6.

A first sub-pixel 122*a* can be a red pixel. A second sub-pixel 122*b* can be a green pixel. A third sub-pixel 122*c* can be a blue pixel. A fourth sub-pixel 122*d* can be a white pixel.

Each of the sub-pixels 122*a*, 122*b*, 122*c* and 122*d* can include a scan switch SW1, a driving switch SW2, a sensing switch SW3, a storage capacitor Cs and an organic light emitting diode OLED.

The scan switch SW1 can be controlled by a scan pulse SP on a gate line G1. Such a scan switch SW1 can be connected between a respective data line D1, D2, D3 or D4 and a first node A.

The driving switch SW2 can be controlled by a potential difference between the first node A and a second node B. Such a driving switch SW2 can be connected between a first driving voltage line Vdd and the second node B.

The sensing switch SW3 can be controlled by a sensing control signal SCS on a sensing line SC1. Such a sensing switch SW3 can be connected between the second node B and a third node C1, C2, C3 or C4.

The storage capacitor Cs can be connected between the first node A and the second B.

The scan switch SW1 can switch a current path between the respective data line D1, D2, D3 or D4 and the first node A in response to the scan pulse SP on the gate line G1. When the scan switch SW1 is turned-on, a data voltage on the respective data line D1, D2, D3 or D4 is transferred to the first node A. To this end, the scan switch SW can include agate electrode connected to the gate line G1, a drain electrode connected to the respective data line D1, D2, D3 or D4, and a source electrode connected to the first node A.

The driving switch SW2 controls a driving current being applied to the organic light emitting diode OLED based on its gate-source voltage. To this end, the driving switch SW2 can include a gate electrode connected to the first node A, a drain electrode connected to the first driving voltage line Vdd, and a source electrode connected to the second node B.

The sensing switch SW3 can transfer a voltage on the second node B to the third node C1, C2, C3 or C4 in response to the sensing control signal SCS. Also, the voltage on the third node C1, C2, C3 or C4 can become a voltage on the sensing line S1.

Such sub-pixels 122*a*, 122*b*, 122*c* and 122*d* can share one sensing line S1 with one another. In detail, one electrode of the sensing switch SW3 of the first sub-pixel 122*a* can be connected to the third node C1, one electrode of the sensing switch SW3 of the second sub-pixel 122*b* can be connected to the third node C2, one electrode of the sensing switch SW3 of the third sub-pixel 122*c* can be connected to the third node C3, and one electrode of the sensing switch SW3 of the fourth sub-pixel 122*d* can be connected to the third node C4. Also, lines branched from the sensing line S1 can be connected to the first through fourth sub-pixels 122*a*, 122*b*, 122*c* and 122*d*. As such, the sensing line S1 can be configurationally shared by the four sub-pixels 122*a*, 122*b*, 122*c* and 122*d*.

Such configuration of allowing the four sub-pixels to share a single sensing line with one another can reduce the number of sensing lines into ¼ compared to the number of data lines D1-Dm. As such, an aperture ratio of the display panel can be enhanced. Also, it can solve the limitation of pad number which is caused by connecting one by one the sensing lines S1-Sk to the sub-pixels.

Although it is explained that a single sensing line is connected to electrodes of the sensing switches of the four sub-pixels arranged in a horizontal direction, the present disclosure is not limited to this. Alternatively, a single sensing line can be connected to the electrodes of the sensing switches of at least two sub-pixels.

In order to detect a threshold voltage and mobility of one of the four sub-pixels, a reference voltage instead of a data voltage is applied to only the respective sub-pixel with the exception of the other sub-pixels. In this case, a black data voltage instead of data voltages is commonly applied to the other sub-pixels which share the sensing line with the respective sub-pixel. As such, it can be prevented that sensing data is affected by the other sub-pixels except from the detection of the threshold voltage and the mobility.

Detection of Threshold Voltage

Figure 7:
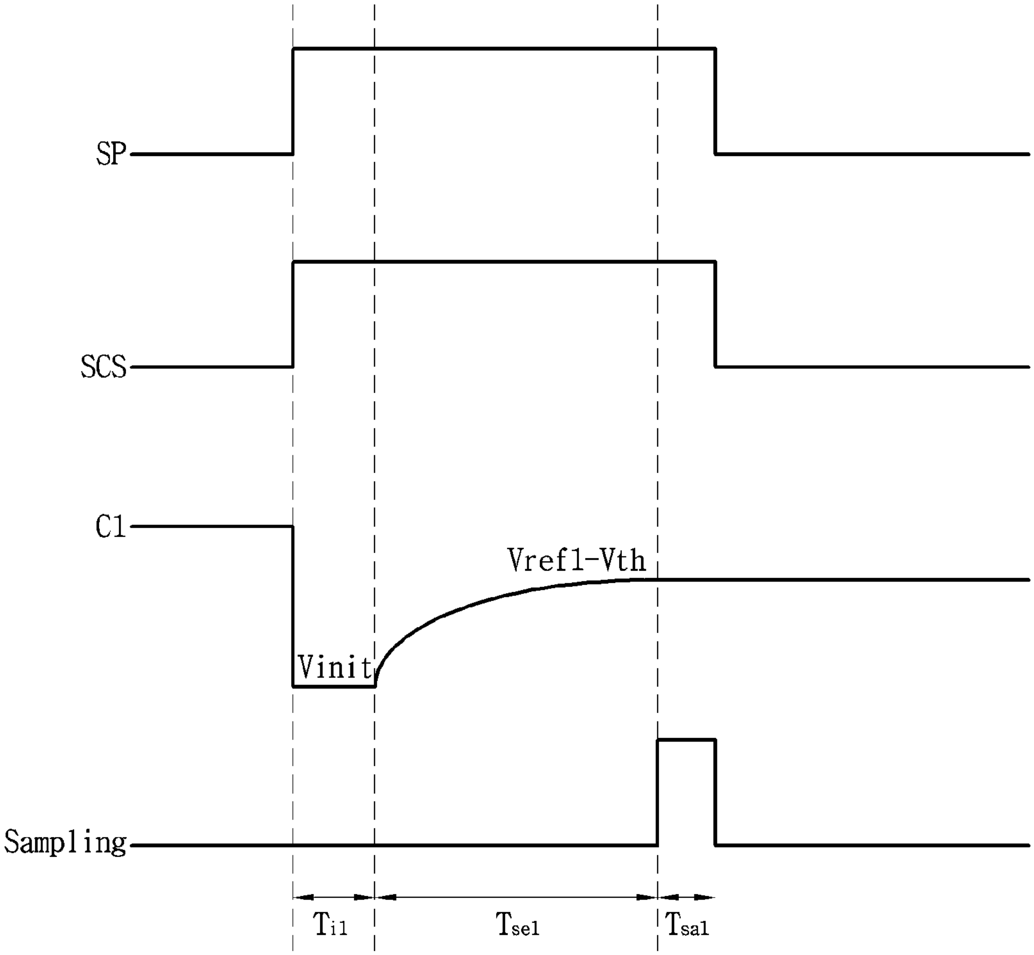
FIG. 7 is a timing chart illustrating operational relations of switch elements at detection of a threshold voltage according to an embodiment of the present disclosure.

FIG. 7 is a timing chart illustrating operational relations of switch elements at detection of a threshold voltage according to an embodiment of the present disclosure.

Referring to FIG. 7, a period of detecting a threshold voltage Vth can be defined into a first initialization interval $T_{i1}$, a first sensing interval $T_{se1}$ and a first sampling interval $T_{sa1}$.

First Initialization Interval $T_{i1}$

The scan switch SW1 is turned-on by the scan pulse SP with a high level, and the sensing switch SW3 is turned-on in response to the sensing control signal SCS with the high level. Also, the third node C1 is charged with the initialization voltage Vinit applied through the sensing line S1. The voltage charged in the third node C1 can be transferred to the second node B via the turned-on sensing switch SW3. As such, the second node B can be charged with the initialization voltage Vinit.

Meanwhile, the first reference voltage Vref1 on the data line D1 is applied to the first node A by the turned-on scan switch SW1. As such, the first node A is charged with the first reference voltage Vref1.

The first reference voltage Vref1 is set higher than the initialization voltage Vinit in order to turn-on the driving switch SW2. The different voltage between the first reference voltage Vref1 and the initialization voltage Vinit can become higher than the threshold voltage of the driving switch SW2. Also, the second driving voltage Vss can be set higher than the voltage on the second node B, in order to reversely drive the organic light emitting diode OLED and prevent the input of a current into the organic light emitting diode OLED.

In this manner, during the initialization interval $T_{i1}$, not only the first node A is charged with the first reference voltage Vref1 but also the second node B is charged with the initialization voltage Vinit. Also, the gate-source voltage of the driving switch SW2 being higher than the threshold voltage turns-on the driving switch SW2 during the initialization interval $T_{i1}$. As such, a current flowing through the driving switch SW2 can become a proper initialization value.

First Sensing Interval $T_{Se1}$

The sensing line S1 becomes a floating state in the first sensing interval $T_{se1}$. To this end, the supply of the initialization voltage Vinit for the sensing line S1 is interrupted.

Because the sensing line S1 becomes the floating state by interrupting the supply of the initialization voltage Vinit, the driving switch SW2 is driven in a source follower mode by a voltage Vgs between the gate electrode and the source electrode of the driving switch SW2. As such, a current flowing through the driving switch SW2 is charged into a parasitic capacitor Cg on the sensing line S1 of the floating state, thereby increasing the voltage on the second node B. The increasing voltage in the second node B enables not only the voltage Vgs between the gate and source electrodes of the driving switch SW2 to be gradually lowered but also the current flowing through the driving switch SW2 to be gradually decreased. When the voltage Vgs between the gate and source electrodes of the driving switch SW2 reaches the threshold voltage of the driving switch SW2, the driving switch SW2 is turned-off. As such, the current flowing through the driving switch SW2 is interrupted and the voltage on the second node B is constantly maintained. Therefore, the threshold voltage of the driving switch SW2 can be detected based on a difference between the voltage on the second node B and the voltage Vg of the gate electrode of the driving switch SW2.

In other words, when the gate-source voltage Vgs of the driving switch SW2 reaches the threshold voltage Vth of the driving switch SW2, the driving switch SW2 is turned-off. At this time, the threshold voltage Vth of the driving switch SW2 is reflected onto the second node B and the third node C1 in the source follower mode. Therefore, the threshold voltage Vth of the driving switch DR can be detected.

First Sampling Interval $T_{Sa1}$

In the first sampling interval $T_{sa1}$, the data driver 120 is connected to (or reads) the sensing line S1, which has been the floating state, in response to a sampling signal Sampling. As such, the voltage on the third node C1 is applied to the data driver 120. The voltage detected from the third node C1 can be used to compensate for the threshold voltage Vth of the driving switch SW2.

In this way, the organic light emitting diode display device according to an embodiment of the present disclosure can be driven in an external compensation mode which obtains data for the compensation of the threshold voltage Vth using a feedback voltage from the third node C1.

First Embodiment

Detection of Mobility

Figure 8:
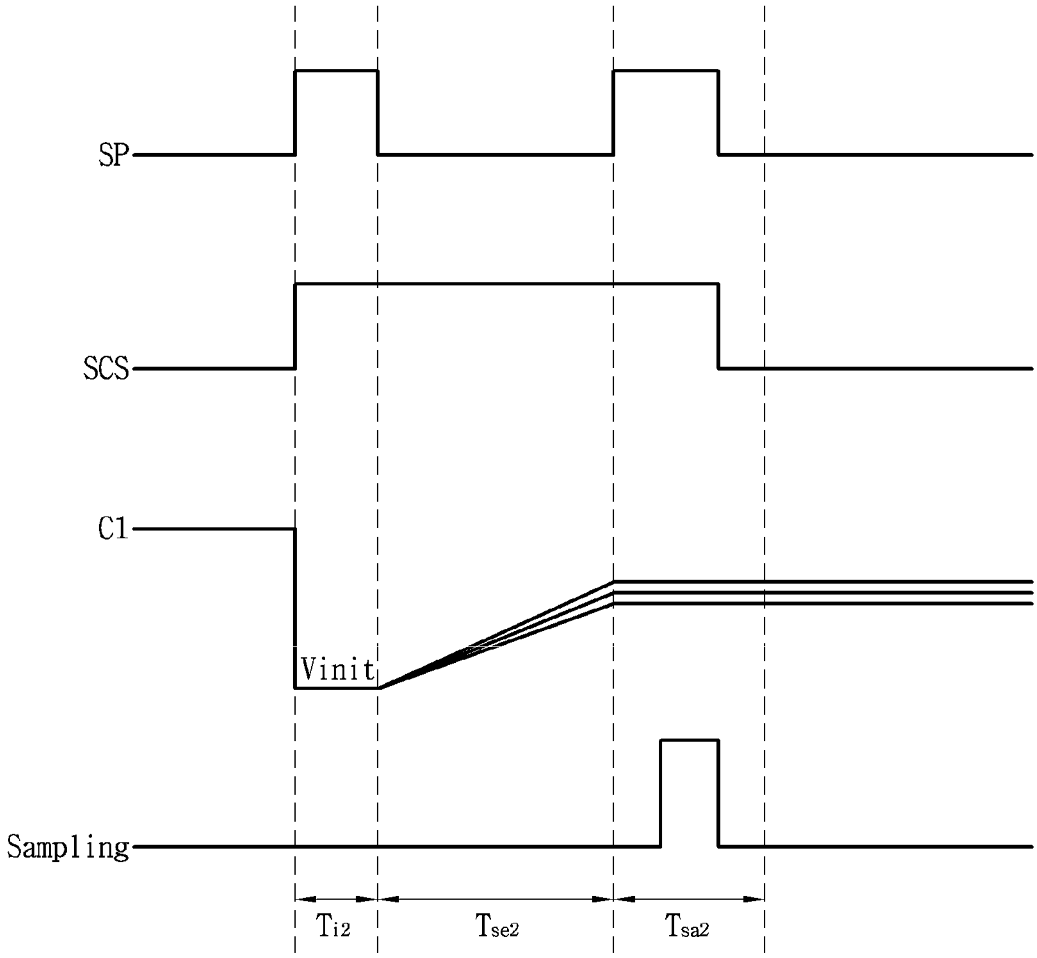
FIG. 8 is a timing chart illustrating operational relations of switch elements at detection of mobility according to a first embodiment of the present disclosure.

FIG. 8 is a timing chart illustrating operational relations of switch elements at mobility detection according to a first embodiment of the present disclosure.

The mobility detection period can be defined into a second initialization interval $T_{i2}$, a second sensing interval $T_{se2}$ and a second sampling interval $T_{sa2}$.

Second Initialization Interval $T_{i2}$

The second initialization interval $T_{i2}$ is a period for initializing the first, second and third nodes A, B and C with a fixed voltage.

In the second initialization interval $T_{i2}$, the scan switch SW1 is turned-on in response to a scan pulse with a high level and the sensing switch SW3 is also turned-on in response to a sensing control signal SCS with the high level. As such, the initialization voltage Vinit on the sensing line S1 can be applied to the second node B, and simultaneously a second reference voltage Vref2 reflecting the detected threshold voltage Vth can be applied to the first node A.

The second reference voltage Vref2 is set higher than the initialization voltage Vinit in order to turn-on the driving switch SW2.

The initialization voltage Vinit can be set to be a proper lower value, which allows the organic light emitting diode OLED not to emit in a period except an emission period, under consideration of the second driving voltage Vss.

In this manner, during the second initialization interval $T_{i2}$, the first node A is charged with the second reference voltage Vref2 and the second node B is charged with the initialization voltage Vinit.

As such, a voltage Vgs between the gate electrode and the source electrode of the driving switch SW2 is higher the threshold voltage Vth of the driving switch SW2. In accordance therewith, the driving switch SW2 is turned-on and a current flowing through the driving switch SW2 has a proper initialization value.

Second Sensing Interval $T_{Se2}$

The second sensing interval Tse2 is a period for sensing mobility of the driving switch.

Because the data voltage (i.e., the second reference voltage Vref2) reflecting the detected threshold voltage of the driving switch SW2, which is obtained in the threshold voltage detection period, is applied to the first node A, a current $I_{oled}$ flowing the organic light emitting diode OLED can be derived from the equation 1 as represented by the following equation 2.

$$I_{oled} = \frac{\beta}{2}(V_{gs} + V_{th} - V_{th})^2 = \frac{\beta}{2}(V_{gs})^2 \qquad \text{Equation 2}$$

In other words, as the detected threshold voltage is reflected, it is clear that the current $I_{oled}$ flowing through the organic light emitting diode OLED is affected by mobility (i.e., 'β' in the equation 2).

In the second sensing interval $T_{se2}$, the scan switch SW1 is turned-off by the scan pulse SP with a low level and the sensing line S1 becomes the floating state by disconnecting from the data driver 120. As such, the supply of the initialization voltage Vinit for the sensing line S1 is interrupted.

The supply interruption of the initialization voltage Vinit enables the current flowing through the driving switch SW2 to be charged in the second node B. As such, the voltage on the second node B rises. Also, the voltage on the first node A being in the floating state increases together with the voltage on the second node B by a capacitor coupling phenomenon of the storage capacitor Cs. As such, the gate-source voltage Vgs of the driving switch SW2 can be constantly maintained and furthermore the driving switch SW2 can be driven as a constant current source. Moreover, the parasitic capacitor Cg on the sensing line S1 can be charged with the current flowing through the driving switch SW2.

In other words, as the current flows into the parasitic or floating capacitor Cg on the sensing line S1, the voltages on the second node B and the third node C1 can increase.

As shown in FIG. 8, the voltage on the third node C1 can be varied along one of three waveforms.

In other words, the waveform of the voltage on the third node C1 can become different. This results from the fact that the inclination of the voltage on the third node C1 is differently varied along the mobility of the driving switch SW2.

If the mobility of the driving switch SW2 becomes higher, the parasitic capacitor Cg on the sensing line S1 is rapidly charged. On the contrary, when the mobility of the driving switch SW2 becomes lower, the parasitic capacitor Cg on the sensing line S1 is slowly charged.

In this manner, the increasing voltage range on the third node C1 can be varied along the mobility of the driving switch SW2. As such, the final voltage on the third node C1 at a sampling time point of the sampling interval can be varied. Therefore, compensation data reflecting the mobility of the driving switch SW2 for each of the pixels can be obtained by detecting the voltage on the third node C1.

Second Sampling Interval $T_{Sa2}$

In the sampling interval $T_{sa2}$, the scan switch SW1 is turned-on by the scan pulse SP with the high level and transfers a black data voltage on the data line D1 to the first node A. The supply of the black data voltage can prevent turning-on and light emission of the organic light emitting diode OLED. Actually, as the voltage on the second node B increases, the voltage of the second node B can become higher than the threshold voltage of the organic light emitting diode OLED. Due to this, the organic light emitting diode OLED can be turned-on and emit light. However, the black data applied to the first node A enables any current not to flow through the driving switch SW2. As such, the organic light emitting diode OLED cannot emit light.

If the scan switch SW1 is turned-on by the scan pulse SP with the high level, the black data voltage on the data line D1 is transferred to the first node A. At this time, the voltage on the first node A decreases by the black data voltage, but a capacitor component of the sensing line S1 having a larger capacitance than that of the storage capacitor Cs enables a coupling phenomenon of the storage capacitor Cs not to affect the second node B. As such, the voltage on the second node B can be stably maintained without any variation. Also, as the voltage on the second node B is constantly maintained, the voltage on the third node C1 can be maintained in a constant level. In accordance therewith, the data driver 120 responsive to the sampling signal Sampling reads (or detects) the voltage on the third node C1. Therefore, deviation in accordance with the mobility of the driving switches SW2 can be compensated.

Figure 9:
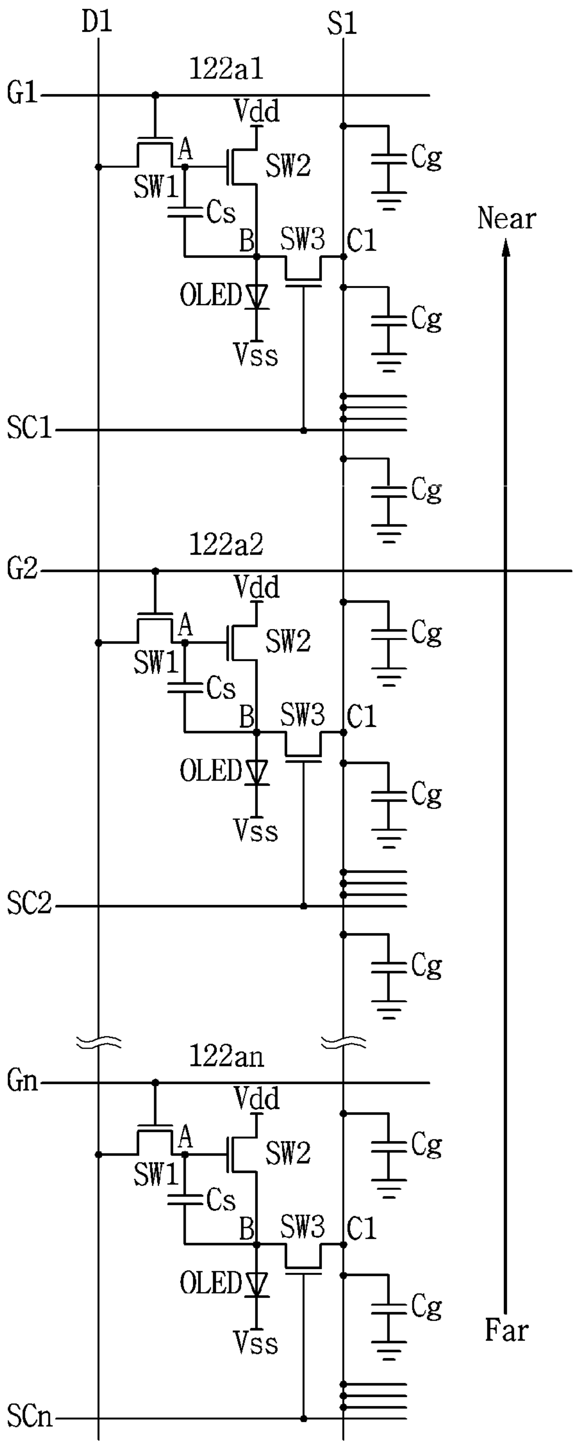
FIG. 9 is a circuit diagram showing sub-pixels arranged in a vertical direction according to an embodiment of the present disclosure.
Figure 10:
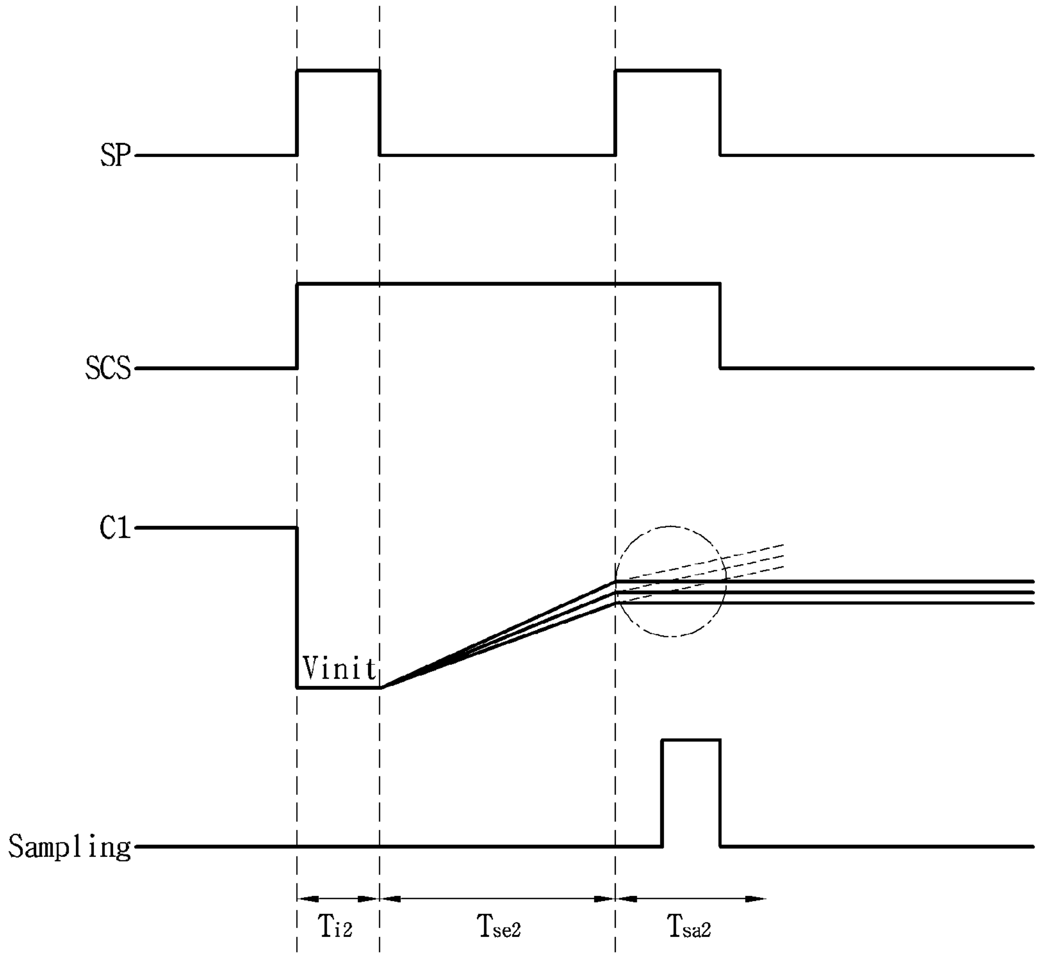
FIG. 10 is a timing chart illustrating increment of a voltage on a node B in a sampling interval due to abnormal characteristics.
Figure 11:
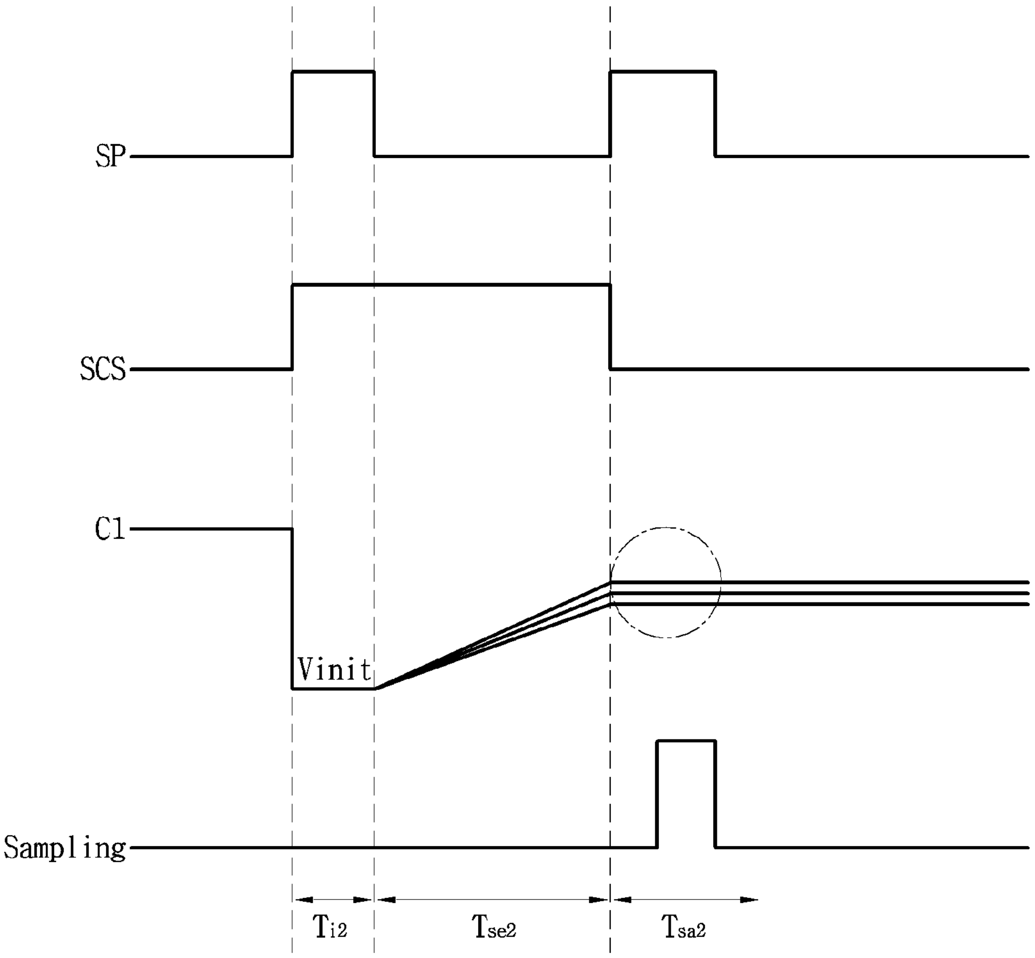
FIG. 11 is a timing chart illustrating operational relations of switch elements for preventing an error in a sampling interval according to a second embodiment of the present disclosure.

FIG. 9 is a circuit diagram showing sub-pixels arranged in a vertical direction according to an embodiment of the present disclosure. FIG. 10 is a timing chart illustrating increment of a voltage on a node B in a sampling interval due to abnormal characteristics. FIG. 11 is a timing chart illustrating operational relations of switch elements for preventing an error in a sampling interval according to a second embodiment of the present disclosure.

Second Embodiment

A driving method of an organic light emitting diode display device according to a second embodiment of the present disclosure can simultaneously compensate mobility difference between driving switches SW2 and parasitic or floating capacitance difference between the sensing lines S.

Connective configuration of sub-pixels arranged in a vertical direction will now be described with reference to FIG. 9. The sub-pixels include a first red sub-pixel 122*a*1, a second red sub-pixel 122*a*2 and an nth red sub-pixel 122*an* which are arranged in a vertical direction. Scan switches SW1 of the first, second and nth red sub-pixels 122*a*1, 122*a*2 and 122*an* can be controlled by scan pulses on respective gate lines G1, G2 and Gn, input a data voltage from a first data line D1, and output sensing voltages through a first sensing line S1.

The first through nth red sub-pixels 122*a*1-122*an* are sequentially driven by the scan pulses SP on the gate lines G1-Gn. As such, the sensing voltages for compensation can be sequentially detected.

Green, blue and white sub-pixels continuously arranged from each of the first through nth red sub-pixels 122*a*1-122*an* can share the first sensing line S1 with the red sub-pixel 122*a* and form a single pixel together with the respective red sub-pixel, even though they are not shown in the drawing. If the detection of the sensing voltage is performed for one of the four sub-pixels within a single pixel, a black data voltage can be applied to the other sub-pixels.

Referring to FIGS. 9 and 10, a voltage on the second node B can increase during the second sampling interval $T_{sa2}$ even though the black data voltage is applied to the first node A. In accordance therewith, a voltage on the third node C1 can also increase due to the voltage on the second node B, as shown by dotted lines. This results from the fact that the voltage of the second node B is affected by a position of the driving switch SW2 being a measurement object, a capacitance value of a parasitic capacitor Cg on the sensing line S1, a distance between the driving switch SW2 of the measurement object and the parasitic capacitor Cg on the sensing line S1 and abnormal properties of elements within the respective sub-pixel.

In order to solve the above-mentioned problem and accurately compensate for the deviation, the sensing control signal SCS being applied to the sensing switch SW3 is preferably transitioned into a low level before the scan pulse is re-raised to the high level.

Referring to FIG. 11, in the second sampling interval $T_{sa2}$, the sensing control signal SCS is transitioned from the high level into the low level before the scan pulse SP is reraised to the high level. As such, the sensing switch SW3 can be turned-off in the second sampling interval $T_{sa2}$. The turned-off sensing switch SW3 enables the third node C1 to be not affected by the voltage increment of the second node B which is caused by the current of the driving switch SW2. In accordance therewith, voltage variation on the third node C1 due to the current flow between the second node B and the third node C1 can be prevented. In other words, the sensing switch SW3 is turned-off before the voltage on the third node C1 is sampled. As such, the third node C1 is electrically disconnected from the second node B, and furthermore a fixed voltage can be developed on the third node C1. Thereafter, a mobility property is accurately detected by sampling the voltage on the third node C1.

Therefore, the mobility property can be precisely compensated.

Detailed Configuration of Data Driver

Figure 12:
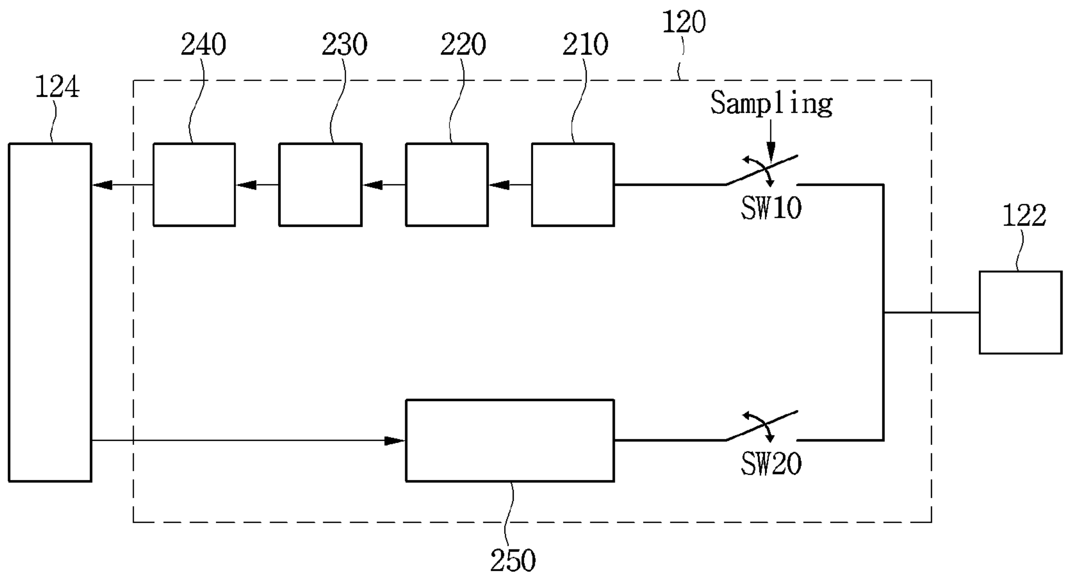
FIG. 12 is a detailed block diagram showing a part configuration of a data driver according to an embodiment of the present disclosure.

FIG. 12 is a detailed block diagram showing a part configuration of a data driver according to an embodiment of the present disclosure.

Referring to FIG. 12, the data driver 120 can include a sampling switch SW10 used for sampling sensing voltages and an initialization voltage switch SW20 used for applying an initialization voltage. Also, the data driver 120 can include a sensing circuit 210, an analog-to-digital converter (ADC) 220, a memory 230, a controller 240 and an initialization voltage source 250. Although it is shown in the drawing that the data driver 120 includes the sampling switch SW10, the initialization voltage switch SW20, the sensing circuit 210, the ADC 220, the memory 230, the controller 240 and the initialization voltage source 250, the data driver 120 can further include components used to apply data voltages and reference voltages to the data lines.

The initialization voltage switch SW20 can be turned-on during a first initialization interval $T_{i1}$ and a second initialization interval $T_{i2}$. The turned-on initialization voltage switch SW20 can transfer the initialization voltage Vinit applied from the initialization voltage source 250 to a pixel 122.

Such an initialization voltage switch SW20 can be controlled by a control signal. The control signal can be applied from a timing controller 124 to the initialization voltage switch SW20.

The sampling switch SW10 can be turned-on by a sampling signal Sampling with a high level during a first sampling interval $T_{sa1}$ and a second sampling interval $T_{sa2}$. The turned-on sampling switch SW10 enables the sensing circuit 210 to sense (or detect) sensing voltages on sensing lines S1-Sk.

The sampling signal Sampling used for controlling the sampling switch SW10 can be applied from the timing controller 124.

Meanwhile, the sampling switch SW10 and the initialization voltage switch SW20 can be turned-off in a first sensing interval $T_{se1}$ and a second sensing interval $T_{se2}$. As such, third nodes C on the sensing lines S1-Sk and second node connected to the third nodes C can become a floating state.

The ADC 220 can convert the sensing voltages, which are detected from the sensing lines S1-Sk by the sensing circuit 210, into digital sensing values. The converted digital sensing values are applied to the memory 230.

The memory 230 can temporally store the digital sensing values. The digital sensing values can become information about threshold voltage and mobility of a driving switch SW2 within the pixel 122. As such, the memory 230 can store information about the threshold voltage and the mobility of the driving switch SW2 within the pixel 122.

The controller 240 can transfer the digital sensing values (i.e., information about the threshold voltage and the mobility of the driving switch SW2 within the pixel 122) stored in the memory 230 to the timing controller 124.

The timing controller 124 can use the digital sensing values (i.e., information about the threshold voltage and the mobility of the driving switch SW2 within the pixel 122) from the controller 240 and control the data driver 120 to apply compensated data voltages to data lines D1-Dm.

As described above, the organic light emitting diode display device and the driving method thereof according to the present disclosure can compensate data voltages on the basis of the threshold voltage and the mobility of the driving switch SW2 within the pixel 122. Also, the organic light emitting diode display device and the driving method thereof can reflect parasitic capacitors Cg on the sensing lines S1-Sk and abnormal properties of elements within the pixel 122 onto the data voltages. Therefore, the organic light emitting diode display device and the driving method thereof can enhance image quality.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the description of the present disclosure.

What is claimed is:

1. An organic light emitting diode display device comprising:

a scan switch controlled by a scan pulse on a gate line and connected between a data line and a first node;

a driving switch which includes a gate electrode connected to the first node, a source electrode connected to a second node, and a drain electrode connected to a first driving voltage line;

a sensing switch controlled by a sensing control signal and connected between the second node and a third node on a sensing line; and an organic light emitting diode connected between the second node and a second driving voltage line, wherein the scan switch and the sensing switch are turned-on to apply a first reference voltage to the first node in a first initialization interval, the scan switch is turned-on and voltages on the second and third nodes are varied in a first sensing interval, the voltage on the third node is detected in a first sampling interval and reflected in a second reference voltage as a threshold voltage of the driving switch, the scan switch and the sensing switch are turned-on to apply the second reference voltage to the first node during a second initialization interval subsequent to the first sampling interval, the second reference voltage is increased as the threshold voltage is increased and the second reference voltage is decreased as the threshold voltage is decreased, the scan switch is turned-off and the voltages on the second and third nodes are varied during a second sensing interval subsequent to the second initialization interval, and a mobility of the driving switch is sensed by detecting the voltage on the third node in a second sampling interval subsequent to the second sensing interval.

2. The organic light emitting diode display device of claim 1, wherein an initialization voltage is applied to the third node through the sensing line in the first initialization interval, and the second node is floated in the first sensing interval.

3. The organic light emitting diode display device of claim 1, wherein the voltage on the third node is detected and used to compensate for mobility of the driving switch.

4. The organic light emitting diode display device of claim 3, wherein an initialization voltage is applied to the third node through the sensing line in the second initialization interval, and the second node is floated in the second sensing interval.

5. The organic light emitting diode display device of claim 3, wherein the scan switch is turned-on to transfer a black data voltage to the first node in the second sampling interval.

6. The organic light emitting diode display device of claim 5, wherein the black data voltage applied to the first node through the turned-on scan switch during the second sampling interval enables the second node to maintain a lower voltage than a threshold voltage of the organic light emitting diode.

7. The organic light emitting diode display device of claim 5, wherein the sensing switch is turned-off before turning-on the scan switch, in the second sampling interval.

8. The organic light emitting diode display device of claim 7, wherein the sensing switch is turned-off before turning-on the scan switch to constantly maintain the voltage on the third node in the second sampling interval.

9. The organic light emitting diode display device of claim 3, further comprises a data driver configured to apply a data voltage and an initialization voltage to the data line and the third node on the sensing line and detect the voltage on the third node of the sensing line.

10. The organic light emitting diode display device of claim 9, wherein the data driver includes:

a sensing circuit configured to detect the voltage on the third node of the sensing line;

an analog-to-digital converter configured to convert the voltage detected by the sensing circuit into a digital value;

a memory configured to store the digital value from the analog-to-digital converter;

a controller configured to apply the digital value stored in the memory to a timing controller; and an initialization voltage source configured to apply the initialization voltage to the sensing line.

11. The organic light emitting diode display device of claim 10, further comprises a sampling switch electrically connected between the sensing circuit and the sensing line and turned-on in the first sampling interval and the second sampling interval.

12. The organic light emitting diode display device of claim 11, further comprises an initialization voltage switch electrically connected between the initialization voltage source and the sensing line and turned-on in the first and second initialization intervals.

13. The organic light emitting diode display device of claim 12, wherein the sampling switch and the initialization voltage switch are turned-off in the first and second sensing intervals.

14. The organic light emitting diode display device of claim 1, wherein the sensing line is shared by a plurality of sub-pixels, each sub-pixel includes a corresponding scan switch, driving switch, sensing switch and organic light emitting diode.

15. The organic light emitting diode display device of claim 14, wherein the plurality of sub-pixels includes red, green, blue and white sub-pixels arranged in a horizontal direction.

16. The organic light emitting diode display device of claim 1, wherein an initialization voltage is higher than a voltage on the second driving voltage line.

17. A method of driving an organic light emitting diode display device, the method comprises:

controlling a scan switch connected between a data line and a first node by applying a scan pulse;

controlling a driving switch connected between a second node connected to an organic light emitting diode and a first driving voltage line by a voltage on the first node;

controlling a sensing switch connected between the second node and a third node on a sensing line by applying a sensing control signal;

applying a first reference voltage to the first node by turning on the scan switch in a first initialization interval;

enabling voltages on the second node and the third node to vary in a first sensing interval subsequent to the first initialization interval, wherein the scan switch is turned-on in the first sensing interval;

detecting a threshold voltage of the driving switch by sensing the voltage on the third node in a first sampling interval subsequent to the first sensing interval, the sensed voltage reflected in a second reference voltage;

applying the second reference voltage and an initialization voltage to the first node and the second node, respectively, by turning-on the scan switch and the sensing switch in a second initialization interval subsequent to the first sampling interval the second reference voltage is increased as the threshold voltage of the driving switch is increased and the second reference voltage is decreased as the threshold voltage of the driving switch is decreased;

enabling not only the driving switch to be driven as a constant current source but also voltages on the second node and the third node to be driven by turning-off the sensing switch and floating the sensing line in a second sensing interval subsequent to the second initialization interval, wherein the scan switch is turned-off in the second sensing interval; and detecting a mobility property of the driving switch by sensing the voltage on the third node after turning-off the sensing switch in a second sampling interval subsequent to the second sensing interval.

18. The method of claim 17, wherein a detection of the mobility property includes applying a black data voltage to the first node by turning-on the scan switch after turning-off the sensing switch.

19. The method of claim 18, wherein the voltage on the third node is sensed after the black data voltage is applied to the first node.

* * * * *